US008864481B2

(12) United States Patent
Yamao et al.

(10) Patent No.: US 8,864,481 B2
(45) Date of Patent: Oct. 21, 2014

(54) MOLD FOR CASTING POLYCRYSTALLINE SILICON INGOT, AND SILICON NITRIDE POWDER FOR MOLD RELEASE MATERIAL THEREOF, SLURRY CONTAINING SILICON NITRIDE POWDER FOR MOLD RELEASE LAYER THEREOF AND MOLD RELEASE MATERIAL FOR CASTING THEREOF (75) Inventors: Takeshi Yamao, Ube (JP); Michio Honda, Ube (JP); Shinsuke Jida, Ube (JP)

(73) Assignee: Ube Industries, Ltd., Ube-shi (JP)

( * ) Notice: Subject to any disclaimer, the term of this patent is extended or adjusted under 35 U.S.C. 154(b) by 0 days.

(21) Appl. No.: 13/976,280

(22) PCT Filed: Jul. 27, 2011

(86) PCT No.: PCT/JP2011/067109
§ 371 (c)(1),
(2), (4) Date: Jun. 26, 2013

(87) PCT Pub. No.: WO2012/090543
PCT Pub. Date: Jul. 5, 2012

(65) Prior Publication Data
US 2013/0273189 A1 Oct. 17, 2013

(30) Foreign Application Priority Data

Dec. 28, 2010 (JP) ................................. 2010-293062

(51) Int. Cl.
C30B 11/00 (2006.01)
B28B 7/36 (2006.01)
C01B 21/068 (2006.01)
C01B 33/02 (2006.01)
C30B 29/06 (2006.01)

(52) U.S. Cl.
CPC ................. *B28B 7/36* (2013.01); *C01B 21/068* (2013.01); *C01B 33/02* (2013.01); *C30B 11/002* (2013.01); *C30B 29/06* (2013.01); *C01P 2004/03* (2013.01); *C01P 2004/61* (2013.01); *C01P 2004/62* (2013.01); *C01P 2006/12* (2013.01); *C01P 2004/52* (2013.01); *C01P 2006/80* (2013.01)
USPC .......................................... 425/95; 106/38.27

(58) Field of Classification Search
CPC ........ B28B 7/36; C01B 21/00; C01P 2004/03
USPC .......................................... 425/95; 106/38.27
See application file for complete search history.

(56) References Cited

U.S. PATENT DOCUMENTS 5,908,797 A * 6/1999 Urashima et al. ............ 501/97.3

FOREIGN PATENT DOCUMENTS

| JP | 59021506 A | 2/1984 |
| JP | 06321508 B2 | 11/1994 |
| JP | 06321510 B2 | 11/1994 |
| JP | 07215706 B2 | 8/1995 |

(Continued)

*Primary Examiner* — Jacob Thomas Minskey
(74) *Attorney, Agent, or Firm* — The Webb Law Firm (57) ABSTRACT Mold for casting a polycrystalline silicon ingot, and a silicon nitride powder for a mold release material thereof, a slurry containing a silicon nitride power for a mold release layer thereof, and a mold release material for casting thereof. The present invention relates to a silicon nitride powder for a mold release material of a mold for casting a polycrystalline silicon ingot characterized in that the percentage of primary particles of granular crystals monodispersed in powders is not less than 95% in terms of the area ratio calculated by analysis of an SEM image.

4 Claims, 3 Drawing Sheets (56) References Cited

FOREIGN PATENT DOCUMENTS

| JP | 09040406 B2 | 2/1997 |
| --- | --- | --- |
| JP | 2002239682 A | 8/2002 |
| JP | 2005095924 A | 4/2005 |
| JP | 2005161359 A | 6/2005 |
| JP | 2007261832 A | 10/2007 |
| WO | 2008026688 A | 3/2008 |

\* cited by examiner

MOLD FOR CASTING POLYCRYSTALLINE SILICON INGOT, AND SILICON NITRIDE POWDER FOR MOLD RELEASE MATERIAL THEREOF, SLURRY CONTAINING SILICON NITRIDE POWDER FOR MOLD RELEASE LAYER THEREOF AND MOLD RELEASE MATERIAL FOR CASTING THEREOF

TECHNICAL FIELD

The present invention relates to a mold for casting a polycrystalline silicon ingot, and a silicon nitride powder for a mold release material thereof, a slurry containing a silicon nitride power for a mold release layer thereof and a mold release material for casting thereof.

BACKGROUND ART

A polycrystalline silicon has been widely used for one type of semiconductor substrates for forming a solar battery and the production volume thereof has been rapidly increased every year. Such a polycrystalline silicon is generally formed by pouring and solidifying a silicon melt heated to melt at high temperature into a mold of a quartz crucible, a divisible graphite crucible or a quartz crucible accommodated into a graphite crucible, of which the inner surface of which is applied with a mold release material using a spray, a brush or a spatula or by adding a silicon raw material to a mold followed by melting once and then solidifying again.

The mold release material prevents a silicon ingot from contaminating with impurities or prevents a silicon melt from adhering to the inner wall surface of a crucible for casting, and plays an important role to release a solidified silicon ingot from a mold. Such a mold release material used includes a high-purity powder of silicon nitride, silicon carbide, and silicon oxide or a mixed power thereof in terms of generally a high melting point of the powder thereof and low contamination of a silicon ingot. In the past, many researches have been carried out to develop a method of forming a mold release material layer on the inner surface of a mold, a method of producing a mold with such treatment, and a method of producing a silicon ingot using the mold thereof in order to increase the productivity of a silicon ingot.

For example, Patent Literature 1 describes that in production of a silicon ingot, peeling of parts of a mold release layer making a silicon melt contact with a mold and contamination of a silicon melt with a peeled product are effectively prevented by eliminating in advance aggregation of silicon nitride particles in a slurry using a silicon nitride powder SN-E10 made of Ube Industries, Ltd. produced by an imide thermal decomposition method, thereby uniformly adhering a slurry including silicon nitride particles coated with the oxide film to the inner surface of a mold base body so as to make the surface of the mold release layer flat, and using the mold with the mold release layer formed herewith for production of a silicon ingot.

Patent Literature 2 also describes, for example, a method of forming a mold release layer having a two-layer structure in which the density is adjusted in order to provide both good adhesion to a mold and good release properties of a silicon ingot, and a method of fusing the mold release material containing silicon oxide added thereto.

CITATION LIST

Patent Literatures

Patent Literature 1: Japanese Patent Application 2008-532114 (WO 2008/026688 A1)
Patent Literature 2: JP 2005-95924 A

SUMMARY OF INVENTION

Technical Problem

However, in Patent Literature 1, though a silicon nitride powder SN-E10 used has the specific surface area in a range of from 9.5 to 12.5 $m^2/g$ and the median particle diameter of the short axis of approximately 0.2 μm determined by a scanning electron microscope (SEM) image, oxidation treatment of the surface of a silicon nitride powder causes aggregation thereof to form an aggregated body with the median particle diameter of approximately 0.7 μm in a particle size distribution. To eliminate such aggregation, a process of grinding a slurry after preparation is required, and further even if a slurry is ground for long hours in a wet ball mill, the median particle diameter of particles in the slurry cannot be reduced to the original value of 0.2 μm in a particle size distribution and to the contrary, reaggregation of particles proceeds.

When a slurry is dispersed in water only by agitation without a grinding process and then applied by spraying, aggregated particles remain in a mold release layer as they are, resulting in uneven distribution of the dense site and low density site in the mold release layer, and in the low density site in the mold release layer, the bonding force among powders constituting the mold release material is small, thereby reducing the strength of a mold release material layer as well as lowering the adhesion to a mold to peel easily. There are such problems as a mold release layer prepared by such a method is brittle and easily peeled and broken, a silicon melt is penetrated into a low density site in the mold release layer to adhere to the inner wall of a casting crucible, thereby generating fragments when releasing a solidified silicon ingot and reducing a yield.

In the method according to Patent Literature 2, a method of forming the mold release layer having a two-layer structure with different densities and a method of adjusting the mold release layer by adding silicon oxide are complicated, and there are such problems as an increase in the process variables in production leads to higher costs and consistency in the quality of a mold release layer is not high resulting in needs to simplify the process, reduce costs, and improve the reliability of quality of the mold release layer.

The present invention has been made in view of the foregoing problems and it is an object of the present invention to provide a mold for casting a polycrystalline silicon ingot, and a silicon nitride powder for a mold release material thereof, a slurry containing a silicon nitride power for a mold release layer thereof, and a mold release material for casting thereof, which can be obtained in low cost and have excellent adhesion to a mold, and prevents the formation of fragments and damage when releasing a solidified silicon ingot, forming a silicon ingot with high quality and in high yield.

Solution to Problem

The present inventors conducted extensive studies to solve the foregoing problems and as a result, have found that a specific silicon nitride power is excellent as a mold release material for production of a silicon ingot, thereby leading to the present invention. That is, the present invention provides a silicon nitride powder for a mold release material of a mold for casting a polycrystalline silicon ingot characterized in that the percentage of primary particles of granular crystals monodispersed in powders is not less than 95% in terms of the area ratio calculated by analysis of an SEM image.

The present invention also provides a slurry containing a silicon nitride powder for a mold release layer of a mold for casting a polycrystalline silicon ingot, in which the silicon nitride powder for a mold release material of the mold for casting the polycrystalline silicon ingot is dispersed in water, a mold release material for casting, which contains a silicon nitride powder for a mold release material, and a mold for casting a polycrystalline silicon ingot in which a mold release layer including the mold release material is formed on the inner surface thereof.

Advantageous Effects of Invention

As described above, the present invention can provide a mold for casting a polycrystalline silicon ingot, and a silicon nitride powder for a mold release material thereof, a slurry containing a silicon nitride powder for a mold release layer thereof, and a mold release material for casing thereof, which can be obtained in low cost and have excellent adhesion to a mold, and prevents the formation of fragments and damage when releasing a solidified silicon ingot, forming a silicon ingot with high quality and in high yield.

DESCRIPTION OF EMBODIMENTS

A silicon nitride powder for a mold release material according to the present invention is a silicon nitride powder used as a mold release material for a mold for casting a polycrystalline silicon ingot, characterized in that the percentage of primary particles of granular crystals monodispersed in the silicon nitride powder is not less than 95% in terms of the area ratio calculated by analysis of an SEM image. Granular crystals of a silicon nitride powder denote the particles which are not needle-like crystals or columnar crystals but hexagonal crystals and have the aspect ratio of no more than 1.5. Since a silicon nitride powder for a mold release material according to the present invention has a higher ratio of a silicon nitride powder occupied in the mold release layer when the mold release layer is formed, a mold release layer densely packed with a high adhesive strength can be formed at low cost on the inner wall of a mold for casting a silicon ingot, preventing the formation of fragments and damage when releasing a solidified silicon ingot to form a silicon ingot with high quality and in high yield.

Since a mold for casting a polycrystalline silicon ingot which uses a slurry containing a silicon nitride powder for a mold release layer according to the present invention to form a mold release layer and which contains a mold release material for casting uses a silicon nitride powder including a higher percentage of primary particles of granular crystals monodispersed in a mold release layer, the mold is characterized in that there are few particles such as needle-like crystals or aggregated fine particles preventing densification of the mold release layer in the case in which a conventional silicon nitride powder is used, but the density of silicon nitride particles in the mold release layer is uniform and dense and the adhesive strength between the mold release layer and a mold is high when the mold release layer is formed. Therefore, penetration of a silicon melt into a mold can be prevented to improve the mold releasing properties of a solidified silicon ingot which can be obtained in high yield.

Figure 1:
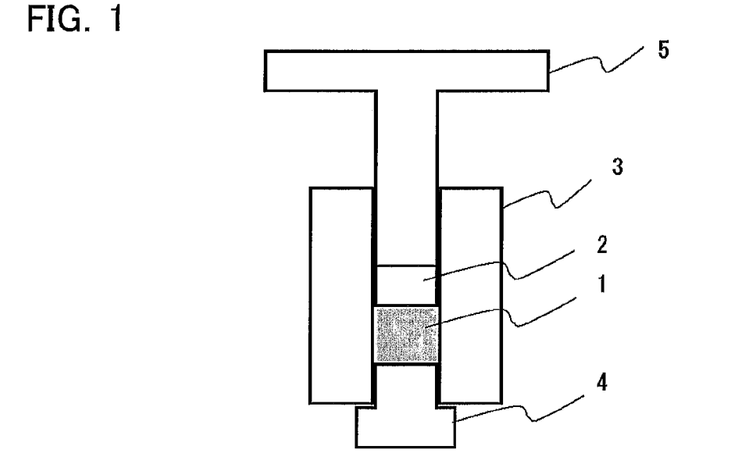
FIG. 1 is a schematic view showing a jig used in measuring the density of a green compact of a crystalline silicon nitride powder pressed at uniaxial pressure.

A silicon nitride powder for a mold release material according to the present invention is characterized by having a high density in a green compact, and for example, the density of a green compact pressed at a uniaxial pressure of 2 tons/cm$^2$ is from 51 to 57% of a theoretical value. The density in a green compact pressed at a uniaxial pressure of 2 tons/cm$^2$ is obtained by filling 0.65 g of the sample in a mold with an inner diameter of 13 φmm in the jig used for measuring the density of a green compact prepared by a uniaxial pressure process according to FIG. 1, pressing to a predetermined pressure in 30 seconds, and maintaining the pressure for 10 seconds, followed by releasing the pressure and determining the volume thereof, and then calculating from the measured value and a theoretical density of 3.186 g/cm$^3$ for a silicon nitride powder sample. When the percentage of monodispersed primary particles of granular crystals is below 95% in terms of the area ratio calculated from analysis of an SEM image, the density of a green compact prepared by a uniaxial pressure process becomes below 51% if the primary particle diameter of the powder is fine. Therefore, it is undesirable since the density of the mold release layer is reduced, a bonding force among powders constituting the mold release layer is low, and the adhesive strength of the mold release layer is decreased as well as adhesion to a mold is reduced and the mold release layer is brittle and easily peeled and broken, and a silicon melt penetrates into the mold release layer to adhere to the inner wall of a casting crucible generating fragments when releasing a solidified silicon ingot, thereby lowering a yield. The density of a green compact prepared by a uniaxial pressure process using a silicon nitride powder of which the area ratio occupied by monodispersed primary particles of granular crystals is not less than 95% is 57% at maximum.

Generally, a silicon nitride powder which can form a green compact with the high density of from 51 to 57% prepared by a uniaxial pressure process can be obtained by grinding a silicon nitride powder with a grinding machine such as an attritor followed by the refining process. However, most of the silicon nitride powder, which was subjected to the refining treatment, become aggregated particles and furthermore a large amount of metallic impurities remain so that the silicon nitride powder is not preferred as a mold release material constituting a mold release layer.

A silicon nitride powder for a mold release material according to the present invention can be obtained by thermally decomposing a nitrogen-containing silane compound obtained by reaction of a silicon halide with ammonia to yield an amorphous silicon nitride powder followed by calcination for crystallization (imide thermal decomposition method) or by grinding and classifying a bulk of silicon nitride powders obtained by direct nitridation of metallic silicon powders (direct nitridation method).

As the imide thermal decomposition method, there are, for example, methods described in JP 2907366 A, JP 2907367 A, and JP 3282456 A, in which a nitrogen-containing silane compound described in JP 3077870 A can be used as a raw material for an amorphous silicon nitride powder.

In production of a silicon nitride powder by the direct nitridation method, a bulk of a nitridated product has to be finely ground and long hours are required for grinding and the powder is contaminated with a large amount of metallic impurities of a grinding media, and not less than several hundreds ppm of metallic impurities still remain even if the powder is treated with a mineral acid for refinement after grinding. In particular, the material with high hardness used in a grinding media contains a large amount of multivalent metals such as Cr and W nearly insoluble in a mineral acid used in refinement, thereby leaving a large amount of them after refinement. Therefore, the imide thermal decomposition method is superior as a method for preparing a silicon nitride powder for a mold release material used in the present invention.

A nitrogen-containing silane compound as a raw material for the imide thermal decomposition method includes silicon diimide ($Si(NH)_2$), silicon tetramide, silicon nitride imide, and silicon chloro imide. These compounds can be produced by a prior art method, for example, the method of reacting in gas phase a silicon halide such as silicon tetrachloride, silicon tetrabromide, silicon tetraiodide with ammonia and a method of reacting the liquid silicon halide with liquid ammonia. An amorphous silicon nitride powder is also produced by the prior art method, for example, a method of thermally decomposing the nitrogen-containing silane compound under an atmosphere of the nitrogen or ammonia gas at a temperature range of from 1,200 to 1,460° C. and a method of reacting a silicon halide such as silicon tetrachloride, silicon tetrabromide, and silicon tetraiodide with ammonia at high temperature.

The particle size and particle shape of a silicon nitride powder for a mold release material according to the present invention can be controlled by, for example, adjusting in the imide thermal decomposition method the heating temperature of thermal decomposition in preparation of an amorphous silicon nitride powder and the crystallization rate with an oxygen content and adjusting the particle growth rate with the temperature elevation rate in calcination for crystallization. It is preferred that the specific surface area value of monodispersed primary particles of granular crystals is adjusted to be from 0.5 to 13 $m^2/g$. In a silicon nitride powder with the specific surface area value below 0.5 $m^2/g$, the percentage of aggregated particles which are fused together is increased. To prepare a silicon nitride powder with the specific surface area exceeding 13 $m^2/g$, the oxygen content in an amorphous silicon nitride powder has to be increased. Therefore, particulates of a silicon nitride powder with the specific surface area exceeding 13 $m^2/g$ is not preferred, since an increase of the aggregation force decreases the percentage of monodispersed primary particles of granular crystals as well as an increase of the oxygen content increases the reactivity with a silicon melt.

Further, a silicon nitride powder for a mold release material according to the present invention can be obtained by reducing the amount of the coarse aggregated particles in a nitrogen-containing silane compound as a raw material and an amorphous silicon nitride powder before calcinating for crystallization in the imide thermal decomposition method. A nitrogen-containing silane compound and amorphous silicon nitride powder have the specific surface area value of from 300 to 850 $m^2/g$ and contain a higher percentage of aggregated particles, in which coarse aggregated particles not less than 50 μm are contained in a range of not less than 10%. The presence of coarse aggregated particles are a cause of simultaneously forming coarse particles by the abnormal grain growth, needle-like crystal particles and fine aggregated particles, thereby forming particles uneven in grain size and grain shape and precluding preparation of a silicon nitride powder with the uniform grain size. A silicon nitride powder for a mold release material with a higher percentage of monodispersed primary particles of granular crystals according to the present invention can be obtained by improving the grinding status of the coarse aggregated particles followed by calcination. A method of reducing coarse aggregated particles includes a method of grinding the aggregated particles in a state of an amorphous silicon nitride powder and a method of changing the condition in a thermal decomposition step of a nitrogen-containing silane compound. A silicon nitride powder after crystallization obtained by going through a step for reducing the coarse aggregated particles before calcination for crystallization in this manner contains a less percentage of coarse particles, needle-like crystalline particles, and fine aggregated particles, thereby allowing for increasing the percentage of monodispersed primary particles of granular crystals without going through a grinding step of aggregated particles.

When aggregated particles are ground in a state of an amorphous silicon nitride powder, the aggregated particles have to be ground until there is no aggregated particle not less than 50 μm. As the grinding method a preferred method is a method in which the number of unused balls for grinding in a vibrating ball mill is reduced to increase the volume-based ball filling ratio of the mill to from 80 to 90%, at which a ratio of the planetary movement of rotation and revolution is increased. Grinding is generally performed by filling a continuous-type vibrating ball mill with resin-coated iron balls at the volume-based ball filling ratio of the mill from 60 to 70%, but this ordinary method leaves a larger empty space in the vibrating mill making more balls move freely, resulting in a longer time for balls for grinding to collide each other leaving the aggregated particles of amorphous silicon nitride powders with the particle diameter up to 300 μm in a particle size distribution. To the contrary, a method of reducing the number of unused balls for grinding in a vibrating ball mill to increase the volume-based ball filling ratio of the mill to from 80 to 90%, at which a ratio of the planetary movement of rotation and revolution is increased can achieve a higher grinding efficiency to reduce the particle diameter of amorphous silicon nitride powders below 50 μm in a particle size distribution. Exceeding the volume-based ball filling ratio of the mill above 90% is not preferred, since balls for grinding become harder to move reducing the grinding efficiency. The number of needle-like crystals and aggregated particles of crystals after crystallization can be reduced by grinding the aggregated particles in amorphous silicon nitride powders with a higher grinding efficiency as compared to a conventional method, yielding silicon nitride powder with a higher density of a molded compact in which the percentage of monodispersed primary particles of granular crystals is increased.

A silicon nitride powder prepared by the imide thermal decomposition method is fine particles, and while there is a mild grinding step to reduce aggregation, a material of resin-coated metal balls and a silicon nitride sintered compact are used as the grinding media to minimize contamination with metal impurities to a very low level of not exceeding several ppm and to yield the powder suitable as a raw material for a mold release material of a mold for casting a polycrystalline silicon nitride ingot. As described in JP 2007-261832 A, the power generating efficiency of a solar cell is decreased by metal impurities contained in a silicon ingot, particularly it is said that its decrease of the efficiency due to contamination with multivalent metals is significant and the effects of the purity of a raw material powder itself as a mold release material on the power generating efficiency is also a common knowledge of one skilled in the art so that it is said that lower contamination with metal impurities is preferred as a raw material powder for a mold release material.

The percentage of monodispersed primary particles of granular crystals of the silicon nitride powder obtained as described above can be readily determined by observing an SEM image of the powder at increase of magnification. Specifically, a sample powder is added to an acetone solvent and dispersed by sonication bath to form a dilute acetone solution of the sample, which drips on an SEM glass slide to dry, followed by vapor deposition of gold to obtain an SEM image, in which dispersed particles can be observed. As similar to a method of calculating the percentage of a silicon nitride powder occupied in the mold release layer described below, this SEM image can be used to trace a contour of a silicon nitride particle to calculate the area ratio using an ImageJ software for image analysis.

A slurry containing a silicon nitride powder for a mold release layer according to the present invention is a slurry in which the silicon nitride powder for a mold release material is dispersed in water and applied to the inner surface of a mold for casting a polycrystalline silicon ingot to dry forming a mold release layer. A slurry containing a silicon nitride powder for a mold release layer according to the present invention can be obtained by adding the silicon nitride powder for a mold release material to distilled water in a vessel, which is filled with balls made of silicon nitride to mix and grind for a predetermined time using a grinding and mixing machine such as a vibrating mill, a ball mill, and a paint shaker, or using an agitator with blades such as paddle blades and a high-speed rotation and revolution type mixer when balls are not used. A slurry containing a silicon nitride powder for a mold release layer according to the present invention is applied to the inner surface of a quartz crucible with the porosity of from 16 to 26% or a quartz crucible accommodated into a graphite crucible as a mold using a spray, a brush or a spatula and dried at the temperature of from 30 to 120° C., followed by heat treatment under atmosphere at a temperature of from 800 to 1200° C. for a predetermined time to fix a mold release layer to a mold.

A mold release material for casting a silicon ingot according to the present invention is a mold release material constituting the mold release layer and characterized by containing a silicon nitride powder for a mold release material related to the present invention.

A mold for casting a silicon ingot according to the present invention is a mold in which the mold release layer is formed on the inner surface thereof, and characterized in that the percentage of a silicon nitride powder occupied in a mold release layer is high, since a silicon nitride powder with a higher percentage of primary particles of granular crystals monodispersed in the mold release layer is used. When silicon nitride particles with the area ratio of monodispersed primary particles of granular crystals to be not less than 95% is used, the area ratio of a silicon nitride powder occupied in the mold release layer is from 45 to 60%. When the area ratio of monodispersed primary particles of granular crystals is no more than 95%, there are many needle-like crystals and aggregated particles of fine particles resulting in the area ratio occupied by the silicon nitride particles to be below 45%, reducing the bonding force among powders constituting the mold release layer, and lowering the adhesive strength of the mold release layer as well as reducing adhesion to a crucible making the mold release layer easily peeled, brittle and easily exfoliated and broken, making a silicon melt penetrating into the mold release layer and adhering to the inner wall of a casting crucible, and generating fragments and breakage when releasing a solidified silicon ingot, thereby reducing a yield. When the area ratio of monodispersed primary particles of granular crystals is not less than 95%, there are less fine particles with a smaller diameter which can penetrate into a space between particles so that the area ratio occupied by silicon nitride particles does not exceed 60%.

EXAMPLES

In the following, specific examples will be illustrated to describe the present invention in more detail.

In examples, the content of metal impurities in an amorphous silicon nitride powder and a silicon nitride powder was quantitatively analyzed by the inductively coupled plasma atomic emission spectroscopy (ICP-AES) after high pressure decomposition with hydrofluoric acid. 0.2 g of a sample was weighed and placed in a Teflon (Registered Trademark) bottle together with nitric acid and hydrofluoric acid, which was sealed with a cap to digest with the acid under high pressure, followed by adding sulfuric acid and heating to concentrate until fumes were generated, to which pure water and hydrochloric acid were added and heated to dissolve soluble salts, followed by quantitative analysis of metals by ICP-AES.

Figure 2:
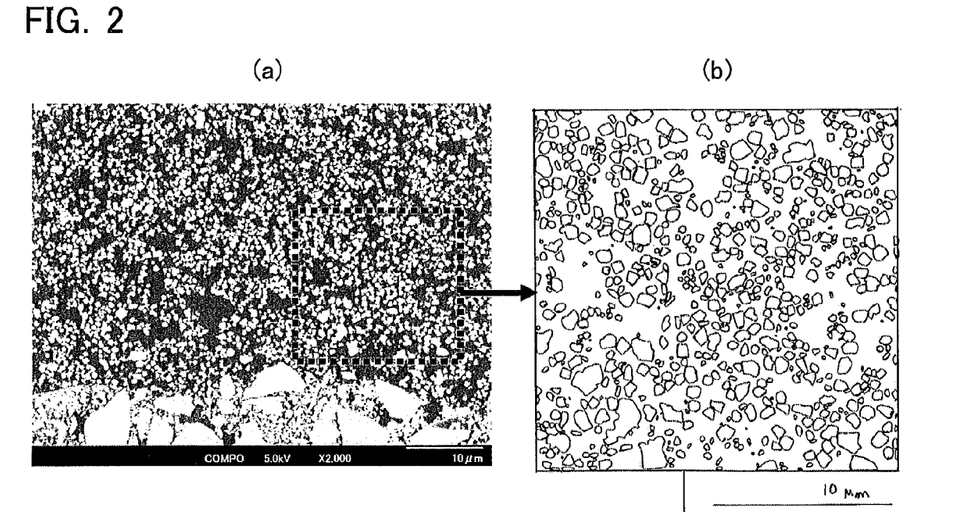
FIG. 2(a) is a field emission scanning electron microscope (FE-SEM) photograph showing one example of a cross-section of a mold release layer formed by applying a silicon nitride powder.
FIG. 2(b) is a drawing obtained by tracing a contour of crystalline silicon nitride particles in order to calculate the area ratio occupied by monodispersed primary particles of granular crystals.

The percentage of a silicon nitride powder occupied in a mold release layer was determined by embedding with an epoxy resin a crucible, to which a mold release material was applied, dried and calcined under atmosphere, taking an image of a cross-section of the mold release layer at 2000 magnification using a field emission scanning electron microscope (FE-SEM) as illustrated in FIG. 2(a), zooming the SEM image to 400%, tracing a contour of silicon nitride particles within a 20 μm square as illustrated in FIG. 2(b), and calculating the area ratio using an ImageJ software for image analysis. In the percentage of primary particles of granular crystals monodispersed in a mold release layer, in the same manner, a contour of monodispersed primary particles in an SEM image was traced to calculate the area ratio using an ImageJ software for image analysis.

The percentage of monodispersed primary particles of granular crystals of a raw material powder could be determined by adding the sample powder to an acetone solvent, which was dispersed by sonication bath to form a dilute acetone solution of the sample, which was dripped on an SEM glass slide and dried, followed by vapor deposition of gold to take an SEM image, in which dispersed particles could be observed. As similar to a method of calculating the percentage of a silicon nitride powder occupied in the mold release layer described above, this SEM image was used to trace a contour of silicon nitride particles to calculate the area ratio using an ImageJ software for image analysis.

When the area ratio was confirmed by this method, it was found that the percentage of primary particles of granular crystals monodispersed in a mold release layer is almost the same as the percentage of primary particles of granular crystals monodispersed in raw material powders.

Figure 3:
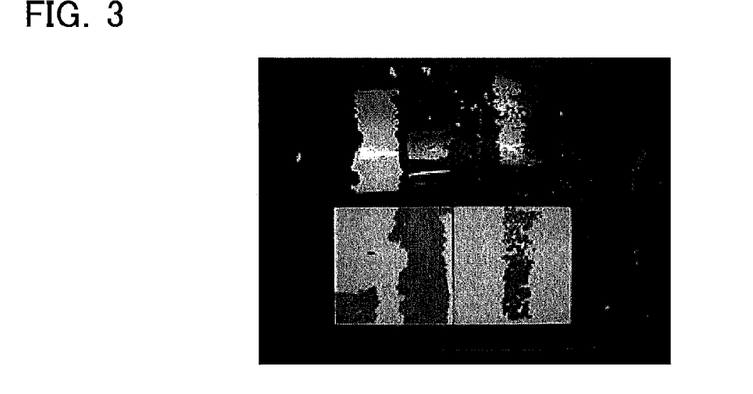
FIG. 3 is a photograph showing the peeling status of a mold release layer to study the peel strength of the mold release layer.

Further, the adhesive strength between a mold release layer and a mold was also evaluated as the peel strength in a simple peeling test using a tape illustrated in FIG. 3. Specifically, a transparent resin adhesive tape 18 mm wide was adhered to the surface of a mold release layer to slowly peel and determine the area of peeled, which was compared as the relative ratio to the contact area for adhesion to evaluate the peel strength. The area of peeled was determined by taking a picture of the tape after peeled, followed by using an ImageJ software for image analysis described above. In this case, the larger a percentage of the area of peeled, the peel strength is lower. The peel strength of a mold release layer of which a silicon nitride powder for a mold release material with the area ratio of monodispersed primary particles of granular crystals to be not less than 95% was used had the area of peeled to be no more than 40% in the adhesion peel test with a tape, indicating good adhesive strength was obtained. When the area of peeled exceeded 40%, the mold release layer was brittle and easily peeled or broken, and a silicon melt could penetrate into a mold release layer to adhere to the inner wall of a casting crucible and generate fragments when releasing a solidified silicon ingot, thereby reducing a yield.

Figure 4:
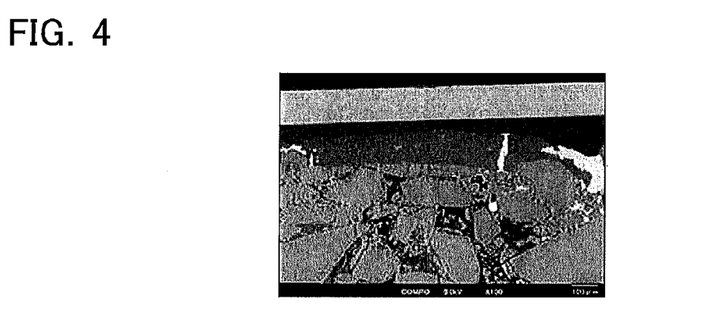
FIG. 4 is a cross-sectional photograph showing an example of the status of a silicon melt penetrating into a mold in Example 3.
Figure 5:
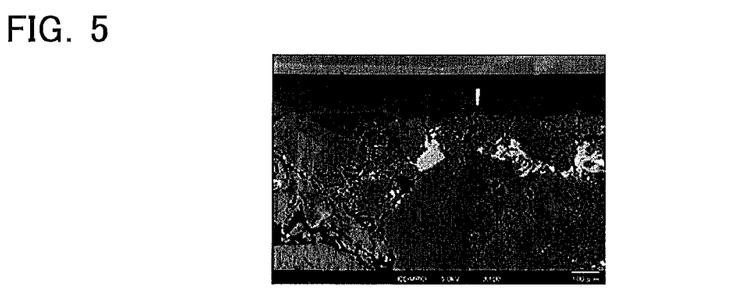
FIG. 5 is a cross-sectional photograph showing other example of the status of a silicon melt penetrating into a mold in Comparative Example 4.

The status of a silicon melt penetrating into a mold was evaluated, as illustrated in FIGS. 4 and 5, by observing an FE-SEM image of a cross-section of the crucible bottom after a silicon melt test to assess the status of a silicon melt penetrating into a crucible. FIG. 4 is an SEM image of a cross-section of a mold release layer near the crucible bottom at 100 magnification using an FE-SEM, wherein the FE-SEM specimen was prepared by applying, as a mold release material, a silicon nitride powder with the specific surface area of 11.8 $m^2/g$ and the density of a green compact pressed at uniaxial pressure of 2 tons/$cm^2$ to be 51.8% according to Example 3 to a quartz crucible with a dimension of a 5 cm square and a depth of 4 cm and dried, followed by heat treatment under atmosphere at 1,100° C. for 4 hours and addition of 75 g of silicon metal granules to the crucible, which was kept under an Ar gas atmosphere at 1,450° C. for 1 hour, and then cooled to pull out, and releasing a silicon ingot from a crucible, which was embedded with an epoxy resin similarly to FIG. 2(a), whereas FIG. 5 is an FE-SEM image of a cross-section of a mold release layer around the same crucible bottom, which was prepared by using an SN-E10 silicon nitride powder with the specific surface area of 11.0 $m^2/g$ and the density of a green compact pressed at uniaxial pressure of 2 tons/$cm^2$ to be 49.5% related to Comparative Example 4.

Example 1

At first, a silicon nitride powder for a mold release material related to Example 1 was prepared as follows. A toluene solution of a silicon tetrachloride at concentration of 30% by volume was reacted with liquid ammonia to synthesize silicon diimide, which was washed with liquid ammonia and dried yielding silicon diimide. An amorphous silicon nitride powder was obtained by thermally decomposing the silicon diimide at 900° C. under a stream of a mixed gas of air and nitrogen (oxygen concentration in a mixed gas was 2% by volume) at a flow rate of 70 L/hour per 1 kg of the powder.

The amorphous silicon nitride powder thus obtained by thermal decomposition had a large specific surface area of from 300 to 850 $m^2/g$ and was obtained in a form of a powder, in which the content of coarse aggregated particles not less than 50 μm in a particle size distribution was about 10%. Aggregated particles of the amorphous silicon nitride powder obtained were ground in a high-efficiency continuous vibrating mill for grinding, to which metal balls for grinding coated with a resin were added to adjust the volume-based filling ratio of the mill to from 80 to 90%, yielding an amorphous silicon nitride powder with the diameter of aggregated particles to be below 50 μm in measurement of a particle size distribution and with metal impurities contaminated to be below 5 ppm by reducing friction between a powder and a metal in a reactor material and a device for handling the powder.

The amorphous silicon nitride powder was placed in a carbon crucible and heated to elevate the temperature from ambient temperature to 1,100° C. in 3 hours, from 1,100 to 1,400° C. at 50° C./hr, and from 1,400 to 1,550° C. in 2 hours and kept at 1,550° C. for 1 hour, and then cooled to pull out. The amorphous silicon nitride powder obtained was subjected to a mild grinding process of aggregated particles in a continuous vibrating mill, to which metal balls for grinding coated with a resin were added to adjust the volume-based filling ratio of the mill to from 70 to 80% yielding a silicon nitride powder for a mold release material according to Example 1.

The specific surface area of the crystalline silicon nitride powder obtained was measured by a surface analyzer of FlowSorb 2300 made of Shimazu Corporation to give 5.5 $m^2/g$. The density of a green compact pressed at uniaxial pressure of 2 tons/$cm^2$ was 53.5%, whereas the area ratio of monodispersed primary particles of granular crystals was 98%.

Tests of evaluating a mold release layer including measurement of the peel strength of a mold release layer, measurement of the area ratio of monodispersed silicon nitride particles in a cross-section of a mold release layer, assessment of the status of a silicon melt penetrating into a crucible, and assessment of the status of a silicon ingot released from a mold were performed using the silicon nitride powder for a mold release material.

At first, 10 g of the silicon nitride powder for a mold release material obtained, 40 g of distilled water, and 100 g of silicon nitride balls with the diameter of 10 φmm were placed in a 100 cc polyethylene bottle to seal with a cap, which was fixed to a vibrating mill to vibrate at the amplitude of 5 mm and the frequency of 1,780 spm for 5 minutes for mixing to prepare a 20% by weight aqueous slurry.

The 20% by volume aqueous slurry described above was sprayed to coat a quartz crucible with the porosity of 16% and the dimension of 5 cm square and the depth of 4 cm preheated at 40° C. and a quartz plate made of the same material, and a cycle of drying at 40° C. and coating was repeated 4 times. The quartz crucible and the quartz plate after coating were dried at 40° C. overnight. After drying, a mold release layer was glazed to the quartz crucible using a box-type electric furnace by elevating the temperature to 1,100° C. in 4 hours under atmosphere and maintaining the temperature at 1,100° C. for 4 hours, followed by lowering the temperature. Thickness of each mold release layer in the crucible and the plate was 150 μm in an average of five measuring points.

The quartz plate to which the mold release material was glazed was used to determine the peel strength, the density of silicon nitride for the mold release layer, and the percentage of monodispersed primary particles of granular crystals. As illustrated in FIG. 3, a transparent resin adhesive tape 18 mm wide was adhered to parts of a mold release layer of the quartz plate glazed with a mold release material, which was slowly peeled to determine the percentage of the area of peeled relative to the contact area for adhesion. Measurement of the area of peeled was performed by taking a picture of the tape after peeled, followed by use of an ImageJ software for image analysis described above. The percentage of the area of peeled was 20%.

The density of silicon nitride for a mold release layer and the percentage of monodispersed primary particles of granular crystals were determined by embedding parts of the glazed quartz plate with an epoxy resin, of which a cross-section was cut to take an SEM image of a cross-section of the mold release layer at 2000 magnification using an FE-SEM, zooming the SEM image to 400% to independently trace a contour of whole silicon nitride particles within a 20 µm square and a contour of only monodispersed primary particles of granular crystals, followed by calculating the area ratio using an ImageJ software for image analysis. The area ratio of whole silicon nitride particles was 50%, whereas the percentage of monodispersed primary particles of granular crystals was 98%.

A quartz crucible glazed with a mold release layer was filled with 75 g of 99.999% pure silicon granules with a size of from 2 to 5 mm, which was heated, using a box-type electric furnace, under a stream of an Ar gas and an atmospheric pressure to elevate the temperature to 1,000° C. in 3 hours and from 1,000 to 1,450° C. in 3 hours and maintained at 1,450° C. for 4 hours, followed by lowering the temperature. After lowering the temperature, the crucible was pulled out from the furnace to observe the releasing status of a mold and visually observe the status of a silicon melt penetrating into the center of the crucible bottom, further followed by embedding the center of the crucible bottom with an epoxy resin, which was cross-sectionally cut to take an SEM image of cross-section of a mold release layer at 100 magnification using an FE-SEM for observing the penetrating status of a silicon melt. The evaluation results are shown in Table 1. Symbols for the status of a silicon melt penetrating into a crucible in Table 1 mean that a double circle symbol indicates the silicon melt stopped its penetration at the surface of the mold release layer, a circle symbol indicates the silicon melt stopped its penetration within the mold release layer, a triangle symbol indicates a small amount of a silicon melt was penetrated into parts of the quartz crucible, and a cross symbol indicates a silicon melt was penetrated through the quartz crucible to leak to the opposite surface of crucible. Symbols for the status of a silicon ingot released from a mold mean that a double circle symbol indicates the silicon ingot was completely released from a mold without adhesion to any parts of the quartz crucible, a circle symbol indicates the silicon ingot was slightly adhered to the quartz crucible but released from a mold, a triangle symbol indicates the silicon ingot was released from the side of the quartz crucible but adhered to its bottom, and a cross symbol indicates the silicon ingot was adhered to a whole quartz crucible and not released from a mold.

TABLE 1

| | | Evaluation of mold release layer | | |
|---|---|---|---|---|
| Class | Area of peeled (%) | Area of monodispersed particles of silicon nitride in a cross-section of mold release layer (%) | Status of molten liquid of silicon penetrating into a crucible | Status of silicon ingot released from a mold |
| Example-1 | 20 | 98 | ○ | ○ |
| Example-2 | 15 | 96 | ○ | ◎ |
| Example-3 | 10 | 95 | ○ | ◎ |
| Example-4 | 5 | 95 | ○ | ◎ |
| Example-5 | 25 | 98 | ○ | ○ |
| Example-6 | 30 | 99 | ○ | ○ |
| Example-7 | 40 | 97 | ○ | ○ |
| Comparative Example-1 | 30 | 80 | X | Δ |
| Comparative Example-2 | 25 | 70 | Δ | Δ |
| Comparative Example-3 | 40 | 50 | X | X |
| Comparative Example-4 | 25 | 55 | Δ | Δ |
| Comparative Example-5 | 85 | 95 | X | X |

Example 2

Next, an amorphous silicon nitride powder was obtained by thermally decomposing silicon diimide similarly prepared to Example 1 at 900° C. under a stream of a mixed gas of air and nitrogen (oxygen concentration in a mixed gas was 2.5% by volume) at a flow rate of 70 L/hour per 1 kg of the powder. The amorphous silicon nitride powder obtained was ground under similar condition to Example 1 in a high-efficiency continuous vibrating mill for grinding, to which metal balls grinding coated with a resin were added to adjust for the volume-based filling ratio of the mill to from 80 to 90%. The amorphous silicon nitride powder after grinding was placed in a carbon crucible and heated to elevate the temperature from ambient temperature to 1,100° C. in 3 hours, from 1,100 to 1,400° C. at 50° C./hr, and from 1,400 to 1,550° C. in 2 hours and kept at 1550° C. for 1 hour, followed by cooling to yield a crystallized silicon nitride powder. The crystallized silicon nitride powder obtained was subjected under similar condition to Example 1 to a mild grinding process of aggregated particles in a continuous vibrating mill, to which metal balls for grinding coated with a resin were added at the volume-based filling ratio of the mill from 70 to 80%, yielding a monodispersed silicon nitride powder for a mold release material according to Example 2. The specific surface area of the silicon nitride powder for a mold release material obtained was 8.5 m$^2$/g, the density of a green compact pressed at uniaxial pressure of 2 tons/cm$^2$ was 52.4%, and the area ratio of monodispersed primary particles of granular crystals was 96%. A method similar to Example 1 was used to evaluate the mold release layer in which the crystalline silicon nitride powder was used. The evaluation results are shown in Table 1.

Example 3

Next, an amorphous silicon nitride powder was obtained by thermally decomposing silicon diimide similarly prepared to Example 1 at 1,050° C. under a stream of a mixed gas of air and nitrogen (oxygen concentration in a mixed gas was 3% by volume) at a flow rate of 70 L/hour per 1 kg of the powder. The amorphous silicon nitride powder obtained was ground under similar condition to Example 1 in a high-efficiency continuous vibrating mill for grinding, to which metal balls for grinding coated with a resin were added to adjust the volume-based filling ratio of the mill to from 80 to 90%. The amorphous silicon nitride powder after grinding was placed in a carbon crucible and heated to elevate the temperature from ambient temperature to 1,100° C. in 3 hours, from 1,100 to 1,400° C. at 60° C./hr, and from 1,400 to 1,550° C. in 2 hour and kept at 1,550° C. for 1 hour, followed by cooling to yield a crystallized silicon nitride powder. The crystallized silicon nitride powder obtained was subjected to a mild grinding process under similar condition to Example 1 to yield a monodispersed silicon nitride powder for a mold release material according to Example 3. The specific surface area of the silicon nitride powder for a mold release material obtained was 11.8 m$^2$/g, the density of a green compact pressed at uniaxial pressure of 2 tons/cm$^2$ was 51.8%, and the area ratio of monodispersed primary particles of granular crystals was 95%. A method similar to Example 1 was used to evaluate the mold release layer in which the crystalline silicon nitride powder was used. The evaluation results are shown in Table 1.

FIG. 4 also illustrates the status of a silicon melt penetrating into a mold in which the silicon nitride powder for a mold release material according to Example 3 was used. It was found from FIG. 4 that a white silicon melt stops its penetration at the mold release layer.

Figure 6:
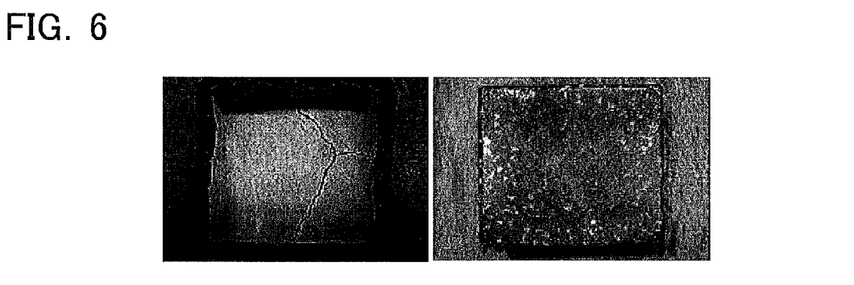
FIG. 6 is a photograph showing an example of the status of a mold and a silicon ingot when releasing the silicon ingot from a mold in Example 3.

FIG. 6 further illustrates the status of a solidified silicon ingot released from a mold after the silicon melting test in Example 3. It was found from FIG. 6 that a silicon melt did not penetrate into or adhere to a mold, indicating good releasing properties of the silicon ingot.

Example 4

Next, an amorphous silicon nitride powder was obtained by thermally decomposing silicon diimide powder similarly prepared to Example 1 at 1,050° C. under a stream of a mixed gas of air and nitrogen (oxygen concentration in a mixed gas was 3.5% by volume) at a flow rate of 70 L/hour per 1 kg of the powder. The amorphous silicon nitride powder obtained was ground under similar condition to Example 1 in a high-efficiency continuous vibrating mill for grinding, to which metal balls for grinding coated with a resin were added to adjust the volume-based filling ratio of the mill to from 80 to 90%. The amorphous silicon nitride powder after grinding was placed in a carbon crucible and heated to elevate the temperature from ambient temperature to 1,100° C. in 3 hours, from 1,100 to 1,400° C. at 80° C./hr, and from 1,400 to 1,550° C. in 2 hours and kept at 1550° C. for 1 hour, followed by cooling to yield a crystallized silicon nitride powder. The crystallized silicon nitride powder obtained was subjected to a mild grinding process under similar condition to Example 1 to yield a monodispersed silicon nitride powder for a mold release material related to Example 4. The specific surface area of the silicon nitride powder for a mold release material obtained was 13.0 m$^2$/g, the density of a green compact pressed at uniaxial pressure of 2 tons/cm$^2$ was 51.3%, and the area ratio of monodispersed primary particles of granular crystals was 95%. A method similar to Example 1 was used to evaluate the mold release layer in which the crystalline silicon nitride powder was used. The evaluation results are shown in Table 1.

Example 5

Next, an amorphous silicon nitride powder was obtained by thermally decomposing silicon diimide similarly prepared to Example 1 at 800° C. under a stream of a mixed gas of air and nitrogen (oxygen concentration in a mixed gas was 1% by volume) at a flow rate of 70 L/hour per 1 kg of the powder. The amorphous silicon nitride powder obtained was ground under similar condition to Example 1 in a high-efficiency continuous vibrating mill for grinding, to which metal balls for grinding coated with a resin were added to adjust the volume-based filling ratio of the mill to from 80 to 90%. The amorphous silicon nitride powder after grinding was placed in a carbon crucible and heated to elevate the temperature from ambient temperature to 1,100° C. in 3 hours, from 1,100 to 1,400° C. at 30° C./hr, and from 1,400 to 1,550° C. in 2 hours and kept at 1,550° C. for 1 hour, followed by cooling to yield a crystallized silicon nitride powder. The crystallized silicon nitride powder obtained was subjected to a mild grinding process under similar condition to Example 1 to yield a monodispersed silicon nitride powder for a mold release material according to Example 5. The specific surface area of the silicon nitride powder for a mold release material obtained was 3.0 m$^2$/g, the density of a green compact pressed at uniaxial pressure of 2 tons/cm$^2$ was 55.1%, and the area ratio of monodispersed primary particles of granular crystals was 98%. A method similar to Example 1 was used to evaluate the mold release layer in which the crystalline silicon nitride powder was used. The evaluation results are shown in Table 1.

Example 6

Next, an amorphous silicon nitride powder was obtained by thermally decomposing silicon diimide similarly prepared to Example 1 at 700° C. under a stream of a mixed gas of air and nitrogen (oxygen concentration in a mixed gas was 0.5% by volume) at a flow rate of 70 L/hour per 1 kg of the powder. The amorphous silicon nitride powder obtained was ground under similar condition to Example 1 in a high-efficiency continuous vibrating mill for grinding, to which metal balls for grinding coated with a resin were added to adjust the volume-based filling ratio of the mill to from 80 to 90%. The amorphous silicon nitride powder after grinding was placed in a carbon crucible and heated to elevate the temperature from ambient temperature to 1,100° C. in 3 hours, from 1,100 to 1,400° C. at 30° C./hr, and from 1,400 to 1,550° C. in 2 hours and kept at 1,550° C. for 1 hour, followed by cooling to yield a crystallized silicon nitride powder. The crystallized silicon nitride powder obtained was subjected to a mild grinding process under similar condition to Example 1 to yield a monodispersed silicon nitride powder for a mold release material according to Example 6. The specific surface area of the silicon nitride powder for a mold release material obtained was 1.1 m$^2$/g, the density of a green compact pressed at uniaxial pressure of 2 tons/cm$^2$ was 55.9%, and the area ratio of monodispersed primary particles of granular crystals was 99%. A method similar to Example 1 was used to evaluate the mold release layer in which the crystalline silicon nitride powder was used. The evaluation results are shown in Table 1.

Example 7

Next, an amorphous silicon nitride powder was obtained by thermally decomposing silicon diimide similarly prepared to Example 1 at 500° C. under a stream of a mixed gas of air and nitrogen (oxygen concentration in a mixed gas was 0.5% by volume) at a flow rate of 70 L/hour per 1 kg of the powder. The amorphous silicon nitride powder obtained was ground under similar condition to Example 1 in a high-efficiency continuous vibrating mill for grinding, to which metal balls for grinding coated with a resin were added to adjust the volume-based filling ratio of the mill to from 80 to 90%. The amorphous silicon nitride powder after grinding was placed in a carbon crucible and heated to elevate the temperature from ambient temperature to 800° C. in 3 hours, from 1,100 to 1,400° C. at 15° C./hr, and from 1,400 to 1,550° C. in 2 hours and kept at 1,550° C. for 1 hour, followed by cooling to yield a crystallized silicon nitride powder. The crystallized silicon nitride powder obtained was subjected to a mild grinding process under similar condition to Example 1 to yield a monodispersed silicon nitride powder for a mold release material according to Example 7: The specific surface area of the silicon nitride powder for a mold release material obtained was 0.5 m$^2$/g, the density of a green compact pressed at uniaxial pressure of 2 tons/cm$^2$ was 56.3%, and the area ratio of monodispersed primary particles of granular crystals was 97%. A method similar to Example 1 was used to evaluate the mold release layer in which the crystalline silicon nitride powder was used. The evaluation results are shown in Table 1.

Comparative Example 1

Next, an amorphous silicon nitride powder was obtained by thermally decomposing silicon diimide powder prepared similarly to Example 5 at 800° C. under a stream of a mixed gas of air and nitrogen (oxygen concentration in a mixed gas was 1% by volume) at a flow rate of 70 L/hour per 1 kg of the powder. The amorphous silicon nitride powder obtained was ground in an ordinary-efficiency continuous vibrating mill for grinding, to which metal balls for grinding coated with a resin were added to adjust the volume-based filling ratio of the mill from 60 to 70%. Since the amorphous silicon nitride powder after grinding remained at a low level of grinding as compared to Example 1, the percentage of aggregated particles was high in a range of not less than 10% for coarse aggregated particles with a size of not less than 50 μm in measurement of a particle size distribution, and aggregated particles of 200 μm at maximum were contained. The amorphous silicon nitride powder after grinding was placed in a carbon crucible and heated to elevate the temperature from ambient temperature to 1,100° C. in 3 hours, from 1,100 to 1,400° C. at 30° C./hr, and from 1,400 to 1,550° C. in 2 hours and kept at 1,550° C. for 1 hour, followed by cooling to yield a crystallized silicon nitride powder related according to Comparative Example 1. The crystallized silicon nitride powder obtained was subjected to a mild grinding process under the similar condition to Example 1 to yield a silicon nitride powder. The specific surface area of the silicon nitride powder obtained was 3.2 m$^2$/g, the density of a green compact pressed at uniaxial pressure of 2 tons/cm$^2$ was 53.0%, and the area ratio of monodispersed primary particles of granular crystals was 90%. A method similar to Example 1 was used to evaluate the mold release layer in which the crystalline silicon nitride powder was used. The evaluation results are shown in Table 1.

Comparative Example 2

Next, an amorphous silicon nitride powder was obtained by thermally decomposing silicon diimide prepared under the similar condition to Example 2 at 900° C. under a stream of a mixed gas of air and nitrogen (oxygen concentration in a mixed gas was 2.5% by volume) at a flow rate of 70 L/hour per 1 kg of the powder. The amorphous silicon nitride powder obtained was ground in an ordinary-efficiency continuous vibrating mill for grinding, to which metal balls for grinding coated with a resin were added to adjust the volume-based filling ratio of the mill to from 60 to 70%. The percentage of aggregated particles in the amorphous silicon nitride powder after grinding was high in a range of not less than 10% for aggregated particles with a size of not less than 50 μm in measurement of a particle size distribution, and aggregated particles of 250 μm at maximum were contained. The amorphous silicon nitride powder after grinding was placed in a carbon crucible and heated to elevate the temperature from ambient temperature to 1,100° C. in 3 hours, from 1,100 to 1,400° C. at 50° C./hr, and from 1,400 to 1,550° C. in 2 hours and kept at 1,550° C. for 1 hour, followed by cooling to yield a crystallized silicon nitride powder according to Comparative Example 2. The crystallized silicon nitride powder obtained was subjected to a mild grinding process under similar condition to Example 1 to yield a silicon nitride powder. The specific surface area of the silicon nitride powder obtained was 8.1 m$^2$/g, the density of a green compact pressed at uniaxial pressure of 2 tons/cm$^2$ was 51.6%, and the area ratio of monodispersed primary particles of granular crystals was 85%. A method similar to Example 1 was used to evaluate the mold release layer in which the crystalline silicon nitride powder was used. The evaluation results are shown in Table 1.

Comparative Example 3

Next, an amorphous silicon nitride powder was obtained by thermally decomposing silicon diimide powder prepared under the similar condition to Example 1 at 1,050° C. under a stream of a mixed gas of air and nitrogen (oxygen concentration in a mixed gas was 5% by volume) at a flow rate of 70 L/hour per 1 kg of the powder. The amorphous silicon nitride powder obtained was ground in an ordinary-efficiency continuous vibrating mill for grinding, to which metal balls for grinding coated with a resin were added to adjust the volume-based filling ratio of the mill to from 60 to 70%. The percentage of aggregated particles in the amorphous silicon nitride powder after grinding was high in a range of not less than 10% for aggregated particles with a size of not less than 50 μm in measurement of a particle size distribution, and aggregated particles of 270 μm at maximum were contained. The amorphous silicon nitride powder after grinding was placed in a carbon crucible and heated to elevate the temperature from ambient temperature to 1,150° C. in 3 hours, from 1,100 to 1,400° C. at 80° C./hr, and from 1,400 to 1,550° C. in 2 hours and kept at 1,550° C. for 1 hour, followed by cooling to yield a crystallized silicon nitride powder according to Comparative Example 3. The crystallized silicon nitride powder obtained was subjected to a mild grinding process under similar condition to Example 1 to yield a silicon nitride powder. The specific surface area of the silicon nitride powder obtained was 14.0 m$^2$/g, the density of a green compact pressed at uniaxial pressure of 2 tons/cm$^2$ was 50.5%, and the area ratio of monodispersed primary particles of granular crystals was 50%. A method similar to Example 1 was used to evaluate the mold release layer in which the crystalline silicon nitride powder was used. The evaluation results are shown in Table 1.

Figure 7:
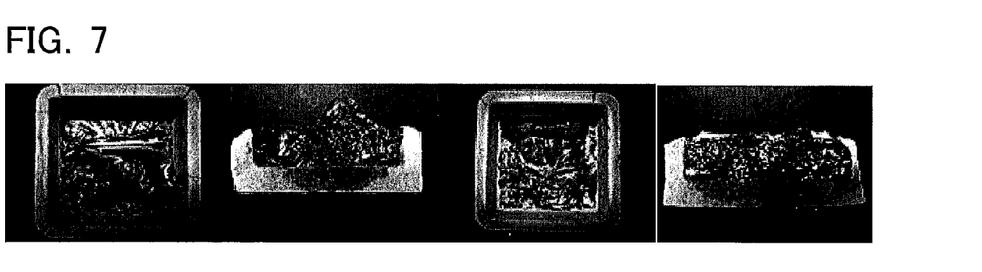
FIG. 7 is a photograph showing other example of the status of a mold and a silicon ingot when releasing the silicon ingot from a mold in Comparative Example 3.

FIG. 7 also illustrates the status of the solidified silicon ingot released from a mold after a silicon melt test in Comparative Example 3. It was found from FIG. 7 that the silicon ingot was adhered to a casting crucible and prevented from release, indicating poor mold releasing properties.

Comparative Example 4

Next, an amorphous silicon nitride powder was obtained by thermally decomposing silicon diimide prepared under similar condition to Example 3 at 1,050° C. under a stream of a mixed gas of air and nitrogen (oxygen concentration in a mixed gas was 3% by volume) at a flow rate of 70 L/hour per 1 kg of the powder. The amorphous silicon nitride powder obtained was ground in an ordinary-efficiency continuous vibrating mill for grinding, to which metal balls for grinding coated with a resin were added to adjust the volume-based filling ratio of the mill to from 50 to 60%. The percentage of aggregated particles in the amorphous silicon nitride powder after grinding was high in a range of not less than 10% for the aggregated particles with a size of not less than 50 μm in measurement of a particle size distribution, and aggregated particles of 300 μm at maximum were contained. The amorphous silicon nitride powder after grinding was placed in a carbon crucible and heated to elevate the temperature from ambient temperature to 1,100° C. in 3 hours, from 1,100 to 1,400° C. at 60° C./hr, and from 1,400 to 1,550° C. in 2 hours and kept at 1,550° C. for 1 hour, followed by cooling to yield a crystallized silicon nitride powder according to Comparative Example 4. The crystallized silicon nitride powder obtained was subjected to a mild grinding process under similar condition to Example 1 to yield a silicon nitride powder. The specific surface area of the silicon nitride powder obtained was 11.0 m$^2$/g, the density of a green compact pressed at uniaxial pressure of 2 tons/cm$^2$ was 49.5%, and the area ratio of monodispersed primary particles of granular crystals was 55%. A method similar to Example 1 was used to evaluate the mold release layer in which the crystalline silicon nitride powder was used. The evaluation results are shown in Table 1.

FIG. 5 also illustrates the status of a silicon melt penetrating into a mold using the silicon nitride powder according to Comparative Example 4. It was found from FIG. 5 that a white silicon melt penetrated into the inside of a crucible.

Comparative Example 5

Next, an amorphous silicon nitride powder was obtained by thermally decomposing silicon diimide powder prepared under similar condition to Example 1 at 500° C. under a stream of a nitrogen gas at a flow rate of 70 L/hour per 1 kg of the powder. The amorphous silicon nitride powder obtained was ground in a high-efficiency continuous vibrating mill for grinding, to which metal balls for grinding coated with a resin were added to adjust the volume-based filling ratio of the mill to from 80 to 90%. The amorphous silicon nitride powder after grinding was placed in a carbon crucible and heated to elevate the temperature from ambient temperature to 1,100° C. in 3 hours, from 1,100 to 1,400° C. at 10° C./hr, and from 1,400 to 1,550° C. in 2 hours and kept at 1,550° C. for 1 hour, followed by cooling to yield a crystallized silicon nitride powder according to Comparative Example 5. The crystallized silicon nitride powder obtained was subjected to a mild grinding process under similar condition to Example 1 to yield a silicon nitride powder. The specific surface area of the silicon nitride powder obtained was 0.3 m$^2$/g, the density of a green compact pressed at uniaxial pressure of 2 tons/cm$^2$ was 57.0%, and the area ratio of monodispersed primary particles of granular crystals was 95%. A method similar to Example 1 was used to evaluate the mold release layer in which the crystalline silicon nitride powder was used. The evaluation results are shown in Table 1.

Figure 8:
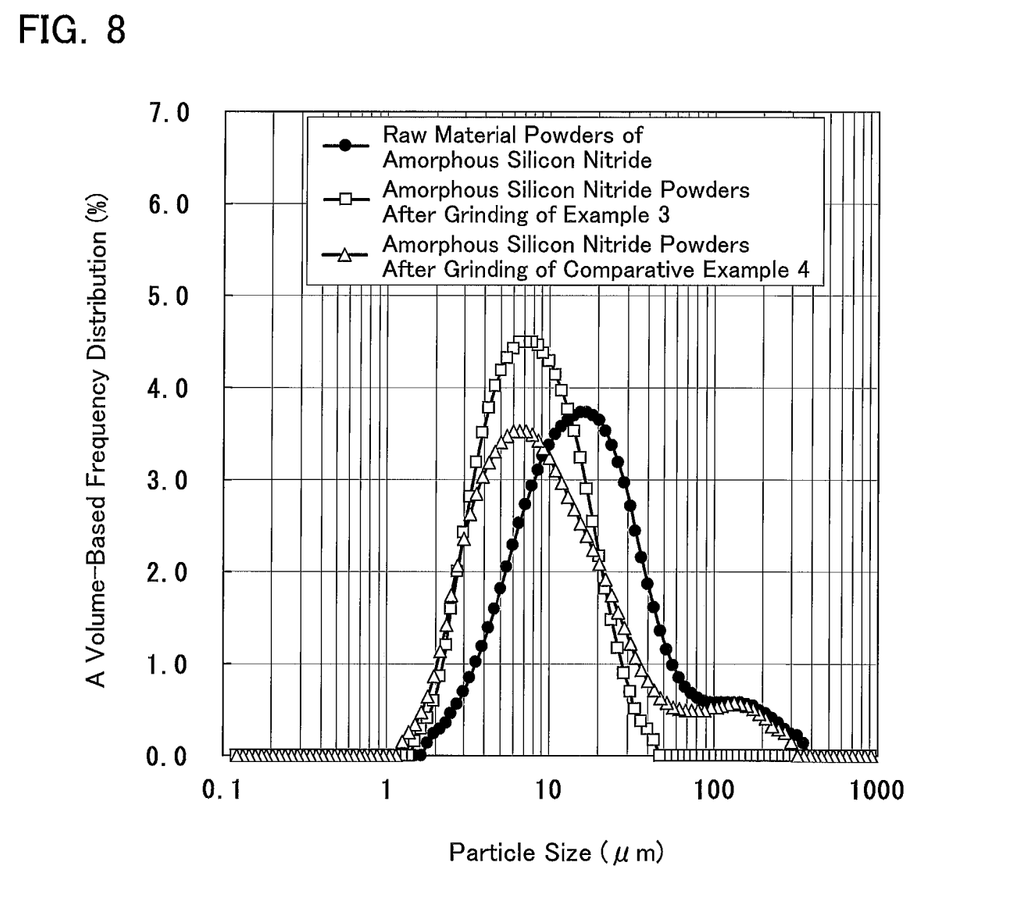
FIG. 8 is a graph showing a volume-based particle size distribution, determined by the laser diffraction/scattering method, of raw material powders of amorphous silicon nitride before grinding obtained in a process of Example 1 and amorphous silicon nitride powders after grinding under the condition of Example 3 and Comparative Example 4.

A silicon nitride powder SN-E10 made of Ube Industries, Ltd. used in Patent Literature 1 is a silicon nitride powder produced by an imide thermal decomposition method, but the amorphous silicon nitride powder as the raw material remains at a very low level of grinding and the amorphous silicon nitride powder after grinding contains coarse aggregated particles with a size of not less than 50 μm in a range of 10% as the amorphous silicon nitride powder after grinding in Comparative Example 4, in which coarse aggregated particles in measurement of a particle size distribution as illustrated in FIG. 8. Therefore, a large amount of aggregated particles remains in the silicon nitride powder after crystallization, which contains a large amount of particles other than monodispersed primary particles of granular crystals. In production of a silicon nitride powder for a mold release material according to the present invention, it is possible to prevent the formation of coarse aggregated particles with a size of not less than 50 μm by improving the grinding process as the amorphous silicon nitride powder after grinding in Example 3, and after a calcination process for crystallization, a silicon nitride powder can be prepared such that the area ratio of monodispersed primary particles of granular crystals is not less than 95%, when an ImageJ software for image analysis is used to analyze an SEM image of the powder. This makes uniform the density and thickness of the mold release layer of the silicon nitride powder formed in a mold, increases the adhesive strength among particles in the mold release layer and between the mold release layer and the mold, and prevents cracking and peeling of the mold release layer, which causes mold release failure.

REFERENCE SIGNS LIST

1 Sample
2 Core
3 Die
4 Lower die punch
5 Upper die punch

The invention claimed is:

1. A silicon nitride powder for a mold release material for a mold for casting a polycrystalline silicon ingot, which consists essentially of primary particles of silicon nitride granular crystals mono-dispersed in the silicon nitride powder, and aggregated silicon nitride particles, wherein a percentage of primary particles of silicon nitride granular crystals monodispersed in the silicon nitride powder are not less than 95% in terms of an area ratio of silicon nitride particles, calculated from analysis of a scanning electron microscope (SEM) image of the powder, and wherein a specific surface area value of the silicon nitride powder is between 0.5 and 13 m$^2$/g.

2. A slurry containing a silicon nitride powder for a mold release layer for a mold of casting a polycrystalline silicon ingot, wherein the silicon nitride powder for a mold release material for a mold of casting a polycrystalline silicon ingot according to claim 1 is dispersed in water.

3. A mold release material for casting a polycrystalline silicon ingot, which contains the silicon nitride powder for a mold release material for a mold of casting a polycrystalline silicon ingot according to claim 1.

4. A mold for casting a polycrystalline silicon ingot, which comprises a mold release layer formed of the mold release material according to claim 3, formed in the inner surface of a mold.

* * * * *